(12) United States Patent
Thaller et al.

(10) Patent No.: US 8,373,472 B2
(45) Date of Patent: Feb. 12, 2013

(54) DIGITAL PLL WITH AUTOMATIC CLOCK ALIGNMENT

(75) Inventors: Edwin Thaller, Faak am See (AT);
Stefano Marsili, Faak am See (AT);
Giuseppe Li Puma, Bochum (DE)

(73) Assignee: Intel Mobile Communications GmbH, Neubiberg (DE)

( * ) Notice: Subject to any disclaimer, the term of this patent is extended or adjusted under 35 U.S.C. 154(b) by 11 days.

(21) Appl. No.: 13/164,096

(22) Filed: Jun. 20, 2011

(65) Prior Publication Data
US 2012/0319749 A1    Dec. 20, 2012

(51) Int. Cl.
*H03L 7/06*     (2006.01)
(52) U.S. Cl. .......................................... 327/158; 327/149
(58) Field of Classification Search .................. 327/149, 327/158
See application file for complete search history.

(56) References Cited

U.S. PATENT DOCUMENTS

| | | | | |
|---|---|---|---|---|
| 7,817,747 | B2* | 10/2010 | Waheed et al. | 375/298 |
| 7,983,375 | B2* | 7/2011 | Dulger et al. | 375/376 |
| 2005/0287967 | A1* | 12/2005 | Hung et al. | 455/127.2 |
| 2006/0033582 | A1* | 2/2006 | Staszewski et al. | 331/16 |
| 2007/0189431 | A1* | 8/2007 | Waheed et al. | 375/376 |
| 2008/0042707 | A1* | 2/2008 | Johnson | 327/158 |
| 2008/0069286 | A1* | 3/2008 | Staszewski et al. | 375/376 |
| 2008/0144707 | A1* | 6/2008 | Tsfati et al. | 375/224 |
| 2010/0283654 | A1* | 11/2010 | Waheed et al. | 341/166 |
| 2011/0007859 | A1* | 1/2011 | Ueda et al. | 375/376 |
| 2011/0148676 | A1* | 6/2011 | Waheed et al. | 341/131 |
| 2011/0267127 | A1* | 11/2011 | Staszewski et al. | 327/306 |
| 2012/0057655 | A1* | 3/2012 | Marsili et al. | 375/300 |

OTHER PUBLICATIONS

Staszewski, Robert. Digitally Controlled Oscillator (DCO)-Baed Architecture for RF Frequency Synthesis in a Deep-Submicrometer CMOS Process. 14 Pages.
Waheed, Khurram, et al. "Curse of Digital Polar Transmission: Precise Delay Alignment in Amplitude and Phase Modulation Paths." 4 Pages.

* cited by examiner

*Primary Examiner* — Adam Houston
(74) *Attorney, Agent, or Firm* — Eschweller & Associates, LLC

(57) ABSTRACT

One embodiment of the present invention relates to a digital phase locked loop (ADPLL) configured to generate a plurality of time-aligned output clock signals having different frequency values. The ADPLL comprises a digital controlled oscillator configured to generate a variable clock signal that is separated into two signal paths operating according to two separate clock domains. A first signal path is configured to generate a feedback signal that synchronizes the variable clock signal with a reference signal. A second signal path comprises a clock divider circuit configured to synchronously divide the variable clock signal to automatically generate a plurality of time-aligned output clock signals having different frequencies. A clock aligner monitors a phase difference between the variable clock signal and one of the plurality of time-aligned output clock signals and generates a control signal that causes a programmable delay line to automatically time-align the output clock signals with the variable clock signal.

20 Claims, 10 Drawing Sheets

DIGITAL PLL WITH AUTOMATIC CLOCK ALIGNMENT

BACKGROUND OF THE INVENTION

Phase locked loops (PLLs) are important components of many modern day communication circuits. During the transmission of a wireless signal, the frequency and phase of the wireless signal may become distorted resulting in differences between the transmitted carrier signal and a receiver's carrier signal. PLLs enable synchronization between the receiver's carrier signal and the transmitted carrier signal by regulating the phase and frequency of carrier signals used within a device according to a reference signal.

FIG. 1a illustrates a simplified block diagram of an exemplary phase locked loop (PLL) 100. The PLL 100 comprises a digitally controlled oscillator (DCO) 106 configured to generate a digital variable clock signal (CLKV) in the RF frequency band, which is provided to a divider chain 110 and a feedback path 112.

The divider chain 110 is configured to divide the variable clock signal CLKV to generate a plurality of output clock signals clk_out1, clk_out2, etc. within different clock domains (i.e., having different frequencies) that are provided as outputs from the PLL 100. The different output clock signals may be provided to different components of a polar modulator transmission chain, such as analog components configured to operate at a high frequency (e.g., DCO, DPA) and digital components configured to operate at lower frequencies.

The feedback path 112 comprises a time-to-digital converter (TDC) 108 configured to receive the variable clock signal CLKV and a reference signal REF. Retiming of the reference signal REF may be performed by determining a phase difference between the variable clock signal CLKV and the reference clock REF. Based upon the computed difference, adjustments are made to the output of phase detector 102. The output of the phase detector 102 is provided to a loop filter 104, which filters the output before it is received at the DCO 106. This PLL feedback loop synchronizes the variable clock signal CLKV with the reference clock REF (i.e., causing the frequency of the variable clock signal CLKV to 'track' the reference signal REF).

Often a delay is present between the various output clock signals of the PLL (e.g., due to the propagation and/or settling delays in various analog elements such as the DCO, dividers, quad switch, buffers, level shifters). FIG. 1b illustrates exemplary clock timing diagrams 114 associated with the PLL of FIG. 1a. In particular, FIG. 1b illustrates a reference signal REF and a variable clock signal CLKV output from DCO 106. At time $T_0$ the variable clock signal CLKV is out of phase from the reference signal REF. However, from time $T_0$ to time $T_1$ the frequency of the variable clock signal is adjusted to follow the reference signal REF.

FIG. 1b also illustrates a first output clock signal clk_out1 and a second output clock signal clk_out2 generated by division of the variable clock signal CLKV. As shown in FIG. 1b, the first output clock signal clk_out1 is generated by dividing the variable clock signal CLKV by two and the second output signal clk_out2 is generated by dividing the variable clock signal CLKV by four. The clock signals exhibit a clock skew around time $T_2$, which can be detrimental to the transmission quality of signals transmitted using polar modulation transmission chains, where close alignment between amplitude modulation (AM) and phase/frequency modulation (PM/FM) paths is required for proper operation.

BRIEF DESCRIPTION OF THE DRAWINGS

FIG. 1b illustrates an exemplary clock timing diagram associated with the phase locked loop of FIG. 1a.

FIG. 5b illustrates a signal diagram corresponding to exemplary clock signals of the digital phase locked loop of FIG. 5a.

FIG. 8b illustrates an exemplary clock timing diagram associated with the clock divider circuit of FIG. 8a.

DETAILED DESCRIPTION OF THE INVENTION

Figure 1A:
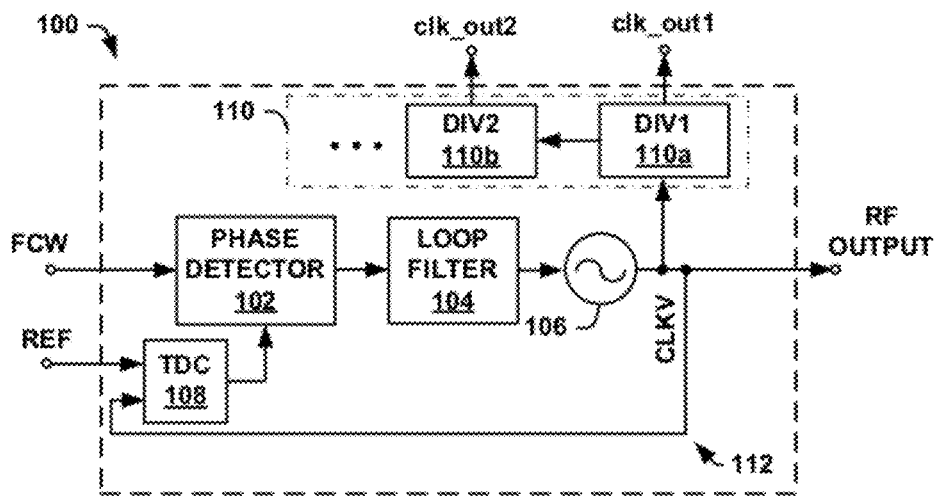
FIG. 1a illustrates a block diagram of an exemplary digital phase locked loop.
Figure 1B:
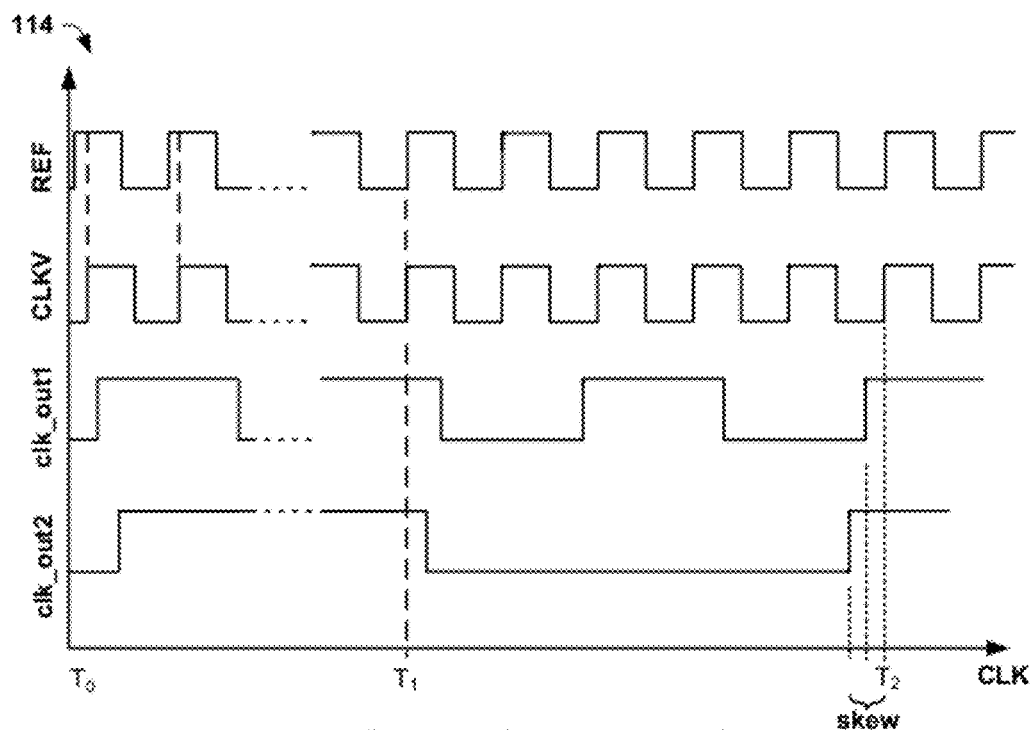

The present invention will now be described with reference to the attached drawing figures, wherein like reference numerals are used to refer to like elements throughout, and wherein the illustrated structures and devices are not necessarily drawn to scale.

Some aspects of the present disclosure provide for a digital phase locked loop (ADPLL) having a delay alignment element that generates a plurality of time-aligned clock signals spanning a plurality of different clock domains (e.g., having different frequency values). In one embodiment, the method and apparatus comprise a digital phase locked loop having a digital controlled oscillator (DCO) configured to generate a variable clock signal that is separated into two separate signal paths operating according to two separate clock domains. A first signal path is configured to generate a PLL feedback signal that synchronizes the variable clock signal with a reference signal. A second signal path comprises a clock divider circuit configured to synchronously generate a plurality of time-aligned output clock signals having different operating frequencies. A phase detector monitors a phase difference between the variable clock signal and one of the plurality of time-aligned output clock signals and generates a control signal, based upon the detected phase difference, which causes a programmable delay element to selectively introduce a delay into the second signal path that shifts clock edges of signals within the second signal path in a manner that automatically time aligns the output clock signals with the variable clock signal. Therefore, the clock divider has freedom to generate output clock signals that are independent of the PLL feedback signal, but which are synchronized with the variable clock signal.

Figure 2:
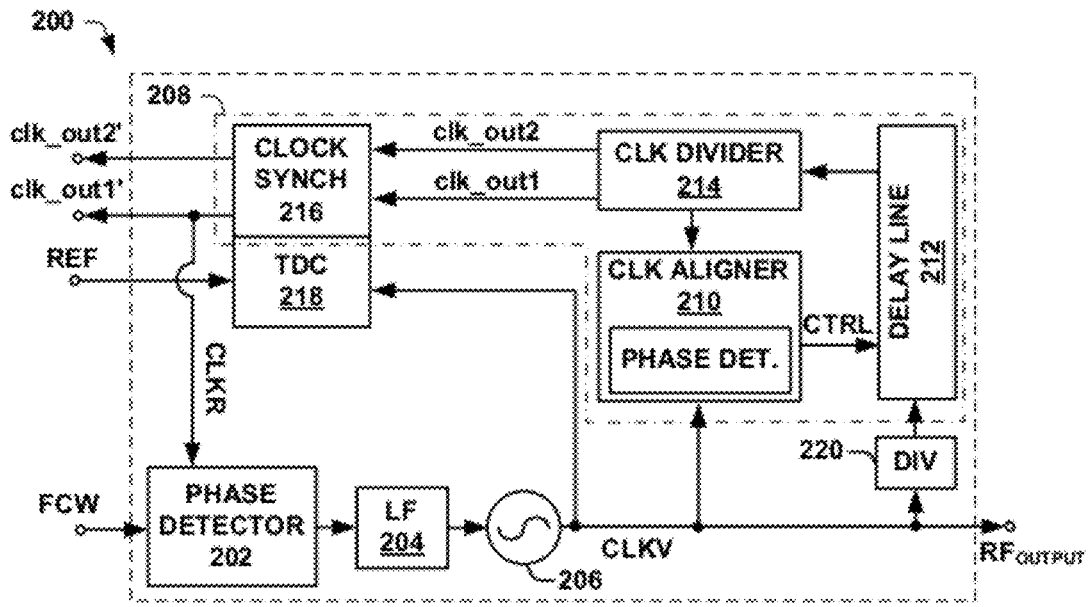
FIG. 2 illustrates a block diagram of a first embodiment of a digital phase locked loop (ADPLL) configured to generate synchronous clock signals within different clock domains.

FIG. 2 illustrates a block diagram of a first embodiment of a digital phase locked loop (ADPLL) 200 configured to generate time-aligned, synchronous output clock signals within different clock domains. As illustrated in FIG. 2, the digital phase locked loop 200 comprises a digital controlled oscillator (DCO) 206 configured to generate a variable clock signal CLKV having a first frequency (e.g., about 2400 MHz).

The variable clock signal CLKV output from the DCO 206 is separated into two separate signal paths. A first signal path comprising a PLL feedback loop has a TDC 218 configured to generate a PLL feedback signal (e.g., a retimed clock signal) that synchronizes the variable clock signal with a reference signal REF. A second signal path comprises a clock divider circuit 214 configured to generate one or more output clock signals. In one embodiment, the separate signal paths may comprise separated clock domains (e.g., have signals comprising different frequencies), therefore providing a first clock signal operating according to a first clock domain and a second clock signal operating according to a second clock domain. Separation between the PLL feedback loop and the clock divider circuit 214 provides more freedom in the possible frequencies that the clock divider circuit 214 can generate (e.g., allowing for division to be performed according to any integer number). A clock aligner 210 is configured to ensure clock alignment between the two signals paths for proper operation of the PLL.

More particularly, a delay alignment circuit 208 coupled to the output of DCO 206 comprises a programmable delay line 212 configured to receive a first divided variable clock signal, output from divider 220, and to selectively introduce a delay into the first divided variable clock signal, resulting in a delayed clock signal. A clock divider circuit 214 receives the delayed clock signal and operates upon the delayed variable clock signal by synchronously dividing the frequency of the delayed clock signal to generate a plurality of output clock signals, respectively having a frequency equal to or lower than that of the delayed clock signal. In general, the clock divider circuit 214 may comprise any type of control state machine.

The clock divider circuit 214 may perform the division based upon a common divider signal (e.g., delayed clock signal) so that the output clock signals are automatically time-aligned. For example, the clock divider circuit 214 may comprise a synchronous divider that suppresses clock pulses according to a common clock signal (e.g., the delayed clock signal or an integer division thereof) to automatically introduce phase adjustments and generate time-aligned output clock signals.

In embodiment, the clock divider circuit 214 is configured to automatically generate time-aligned synchronous clock signals via a clock gating methodology, wherein the clock divider circuit 214 generates a clock transition (e.g., a rising edge, falling edge) based upon an enable control signal (e.g., at the rising or falling clock edge of the enable control signal). In such an embodiment, the delayed clock signal is passed through a clock gating cell which in one embodiment may be constantly enabled, to provide for an equal clock delay between the plurality of output clock signals generated by the clock divider circuit 214. In general, the use of a clock gating methodology allows the phase of the output clock signals to be adjusted according to different grids. For example, the phase of the output clock signals may be adjusted according to on a fine grid of the first divided variable clock signal (e.g., a 700 MHz clock) output from divider 220 or on a courser grid of an output clock signal generated by the clock divider circuit 214 (e.g., a 160 MHz clock).

One of the plurality of output clock signals may be provided from the clock divider circuit 214 to a clock aligner 210. The clock aligner 210 monitors the one of the plurality of output clock signals and the variable clock signal CLKV output from DCO 206 (driven by a retimed clock signal to follow a reference signal REF), and determines a phase difference therebetween. Based upon the phase difference, the clock aligner 210 generates a control signal CTRL which is provided to the programmable delay line 212. The control signal causes the programmable delay line 212 to introduce/adjust a time delay into the divided variable clock signal before it is input into the clock divider circuit 214, thereby indirectly controlling the selective introduction of a time delay into the output clock signals so that the output clock signals are automatically time aligned with the variable clock signal (e.g., the output clock signals have rising or falling edges that are aligned with the variable clock signal rising or falling edges).

In one embodiment, the clock-aligner 210 comprises a phase detector configured to monitor the rising or falling edges of the variable clock signal CLKV and one of the plurality of output clock signals clk_out1, clk_out2, etc. and based thereupon to generate a control signal CTRL that adjusts the delay of the programmable delay line 212 until the rising or falling edges of the variable clock signal CLKV and the one of the plurality of output clock signals is aligned in time.

Therefore, the output clock signals clk_out1, clk_out2 of PLL 200 are generated by introducing a time delay that aligns clock edges of the variable clock signal with clock edges of the output clock signals and by dividing the delayed clock signal based upon a common clock signal. Such synchronization results in output clock signals having a matched clock path delay. For example, the delay line 212 will introduce a time delay into the delayed clock signal that causes the first output signal clk_out1 generated from the delayed clock signal to have the same clock delay the second clock signal clk_out2 generated from the delayed clock signal.

In one embodiment, the plurality of output clock signals are also provided to a clock synchronization unit 216 before being provided as outputs clk_out1', clk_out2' (which may be the same or different than clk_out1, clk_out2, respectively) from the digital phase locked loop 200. The clock synchronization unit 216 is configured to generate a retimed clock signal CLKR using one or more of the plurality of time-aligned output clocks for re-sampling of a reference clock REF, in order to generate a retimed clock signal CLKR that is used as a master clock for the ADPLL loop. In one embodiment, the retimed clock signal CLKR may comprise one of the outputs clk_out1' or clk_out2', as described in more detail below.

The retimed clock signal CLKR is provided to a phase detector 202. The retimed clock signal CLKR causes the phase detector 202 to generate an output signal, which is filtered by loop filter 204, before adjusting the frequency and/or phase of the variable clock signal CLKV output from the DCO 206. The adjustment of the frequency and/or phase of the variable clock signal causes the variable clock signal to follow reference signal REF. In one embodiment, the clock synchronization unit may comprise the TDC 218.

Figure 3:
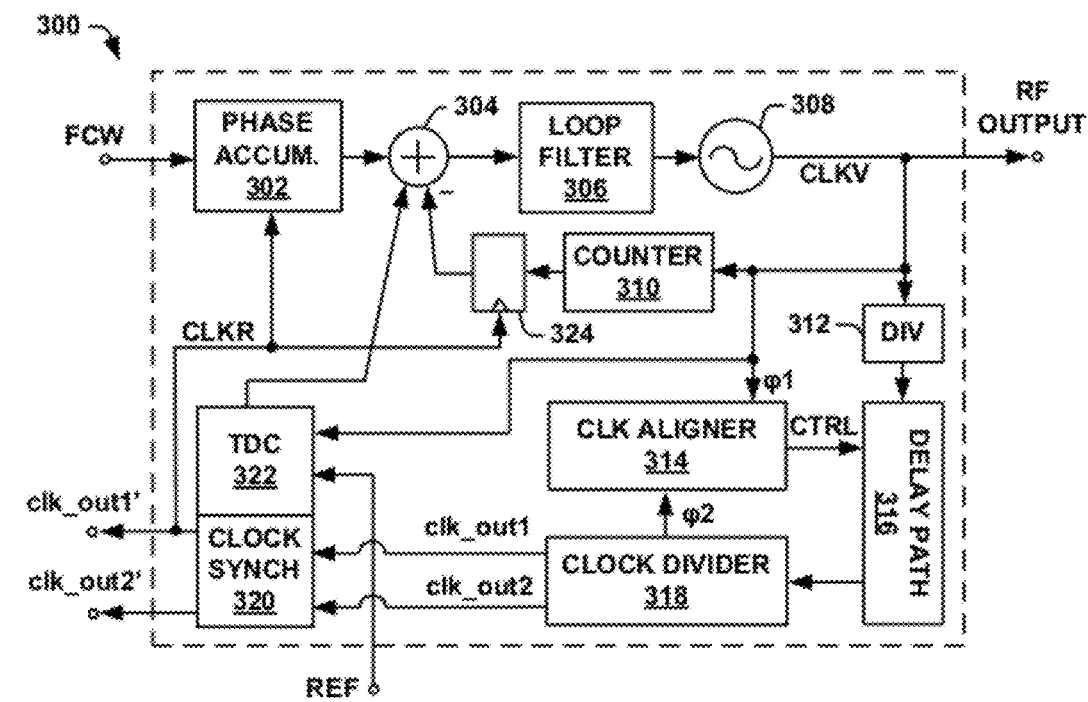
FIG. 3 illustrates a block diagram of a more detailed embodiment of a digital phase locked loop (ADPLL) configured to generate synchronous clock signals within different clock domains.

FIG. 3 illustrates a block diagram of a more detailed embodiment of a digital phase locked loop (ADPLL) 300 configured to generate time-aligned synchronous output clock signals within different clock domains. As illustrated in FIG. 3, a frequency command word (FCW) is received at a reference phase accumulator 302 to establish the target variable clock signal frequency.

The variable clock signal CLKV output from the DCO 308 is provided to a TDC 322 and a divider 312. As described above, the divider 312 generates a divided variable clock signal that is provided to the delay line 316, which introduces a variable time delay (controlled by clock aligner 314) into the divided variable clock signal CLKV before providing a delayed clock signal to a clock divider circuit 318 that generates a plurality of time-aligned output clock signals clk_out1, clk_out2, etc.

The time-aligned output clock signals clk_out1, clk_out2 are provided to a clock synchronization unit 320 that may be coupled to the TDC 322 and is configured to use one or more of the output clock signals clk_out1', clk_out2', etc. to retime the reference clock REF (e.g., to oversample the reference clock REF and generate a retimed clock signal CLKR). The TDC 322 is configured to a determine a time delay error between the variable clock CLKV and reference clock REF (e.g., a retiming error) and to provide a digital signal corresponding to the retiming error to the reference phase detector 304 in order to compensate for quantization errors of the system. In the embodiment, shown in FIG. 3, the digital phase locked loop comprises a reference phase detector 304 consisting of an adder configured to sum the signals received from phase accumulator 302, TDC 322, and register 324, according to the illustrated signs (positive signs not shown, negative sign shown on input from register 324).

The variable clock signal CLKV is also provided to a counter 310. The output of counter 310 is sampled by register 324 with the retimed clock signal CLKR to ensure synchronization between the retimed clock signal and the variable clock signal (e.g., the retimed clock signal under-samples the output of the counter 310 so that a comparison of the phases of the oscillator and reference signal can be achieved using the same clock). The output of the register 324 is provided to the phase detector 304, which generates an output signal that is filtered by loop filter 306 before adjusting operation of the DCO to generate variable clock signal CLKV that follows the reference signal.

Figure 4:
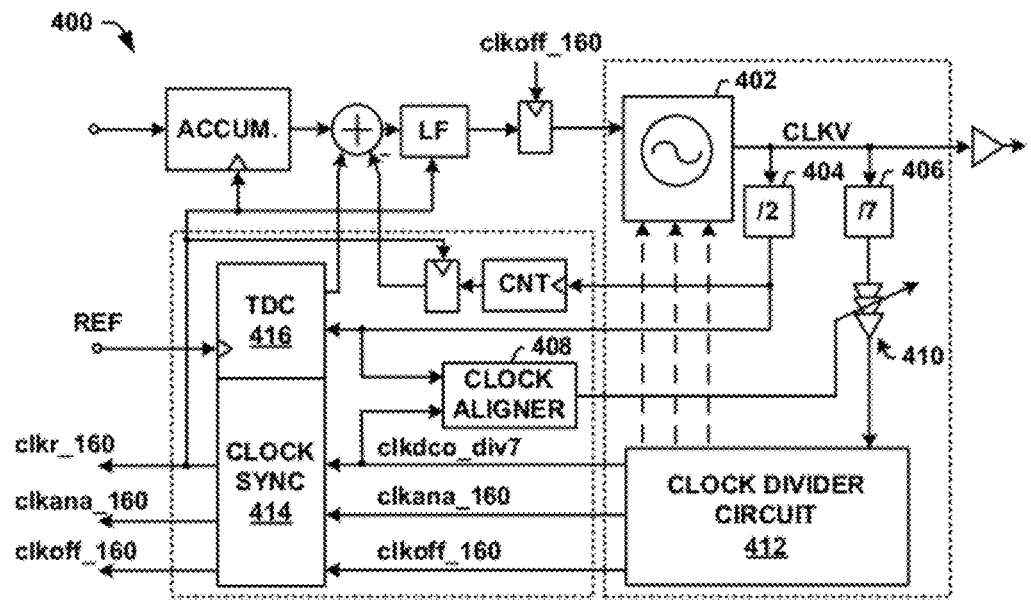
FIG. 4 illustrates a block diagram of a specific embodiment of a digital phase locked loop (ADPLL) configured to generate synchronous clock signals within different clock domains.

FIG. 4 illustrates a block diagram of a specific embodiment of a digital phase locked loop (ADPLL) 400 configured to generate synchronous output clock signals within different clock domains. As illustrated in FIG. 4, a digital controlled oscillator (DCO) 402 is configured to generate a variable clock signal CLKV having an oscillation frequency that is twice (2×) an RF channel frequency (e.g., ~4900 MHz). The variable clock signal CLKV is provided to a first and second divider respectively configured to generate signals having different clock domains.

The first divider 404, comprising a divide-by-two divider, is coupled between the output of the DCO 402 and the clock aligner 408. The first divider 404 divides the frequency of the variable clock signal by 2 to generate an RF frequency signal (clkdco_div2) having a frequency that is ½ the frequency of the variable clock signal (e.g., ~2450 MHz). A second divider 406 is coupled between the output of the DCO 402 and the programmable delay line 410. In one embodiment, the second divider 406 comprises a divide by 7 divider configured to divide the frequency of the variable clock signal by 7 to generate a signal (clkdco_div7) having a frequency that is $\frac{1}{7}^{th}$ the frequency of the variable clock signal (e.g., ~700 MHz). Therefore, the first and second dividers separate the variable clock signal into two distinct separate clock domains, one divided by 2 to generate feedback signal for PLL and one divided by 7 to generate clock signal that is provided to the programmable delay line 410.

To synchronize signals in the separate clock domains a programmable delay line 410 is configured to introduce a delay the divided by 7 clock signal (clkdco_div7). The output of the programmable delay line 410 is connected to a clock divider circuit 412 comprising a clock gating cell which is constantly enabled. The clock divider circuit 412 generates output clock signals (e.g., for modulation paths) from the clkdco_div7 clock signal in a synchronous way via clock gating. For example, the clkdco_div7 clock signal is passed through the clock gating cell to have the same delay as divided by 4 clocks clkana_tdc_160 and clkoff_tdc_160 (e.g., respectively having frequencies of ~160 MHz). In FIG. 4, the clock divider circuit 412 is configured to generate clocks for the phase modulation path of the ADPLL (clkdco_div7, clkana_160, clkoff_160) and clocks for the DCO that are illustrated as dashed lines.

The modulation clocks (clk_div7, clkana_160, clkoff_160) are fed to a clock synchronization unit 414 (e.g., in TDC 416) where they are used for re-sampling of the reference clock REF in order to generate retimed clock clkr_160, which serves as the master clock for the ADPLL loop. In one embodiment, the reference clock REF (e.g., 26 MHz) is first synchronized with clkdco_div2 (e.g., 2450 MHz), and then synchronized with clk_div7 (e.g., 700 MHz) and then synchronized with a 160 MHz clock (e.g., clkana_160) to generate a retimed clock clkr_160 that is aligned with the modulation path clocks.

The clock aligner 408 monitors the rising (or falling) edges of clock signals clkdco_div2 and clkdco_div7 with a phase detector. The clock aligner 408 adjusts the programmable delay line 410 upstream of the clock divider circuit 412, depending on the phase detector output, until the edges of the monitored clocks are aligned, within the accuracy of one delay-line stage delay. This results in the ADPLL loop master clock CLKR_160 being aligned with the modulation path clocks.

Figure 5B:
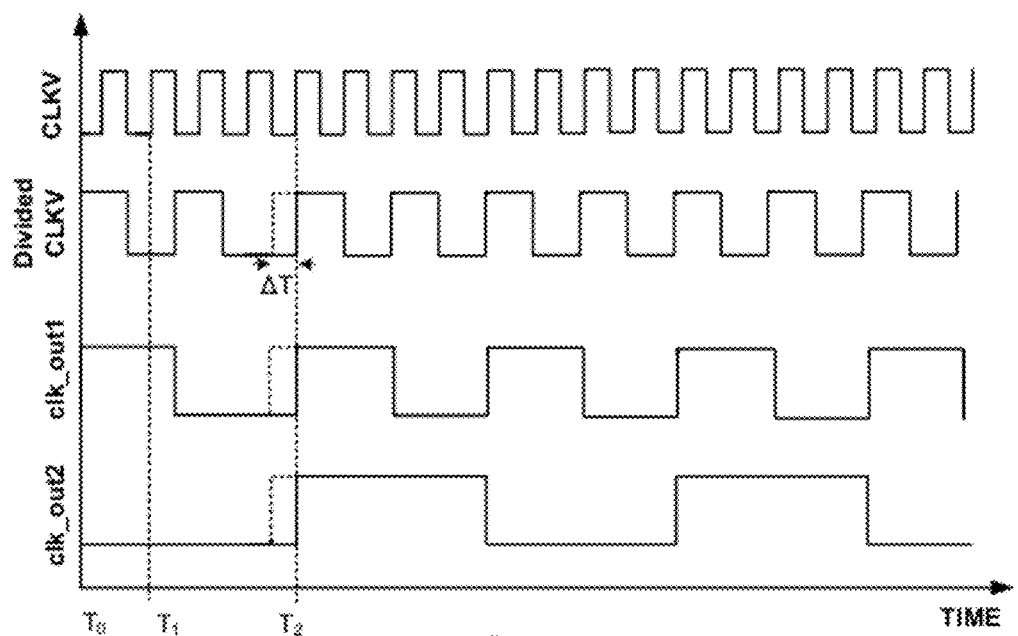
Figure 5A:
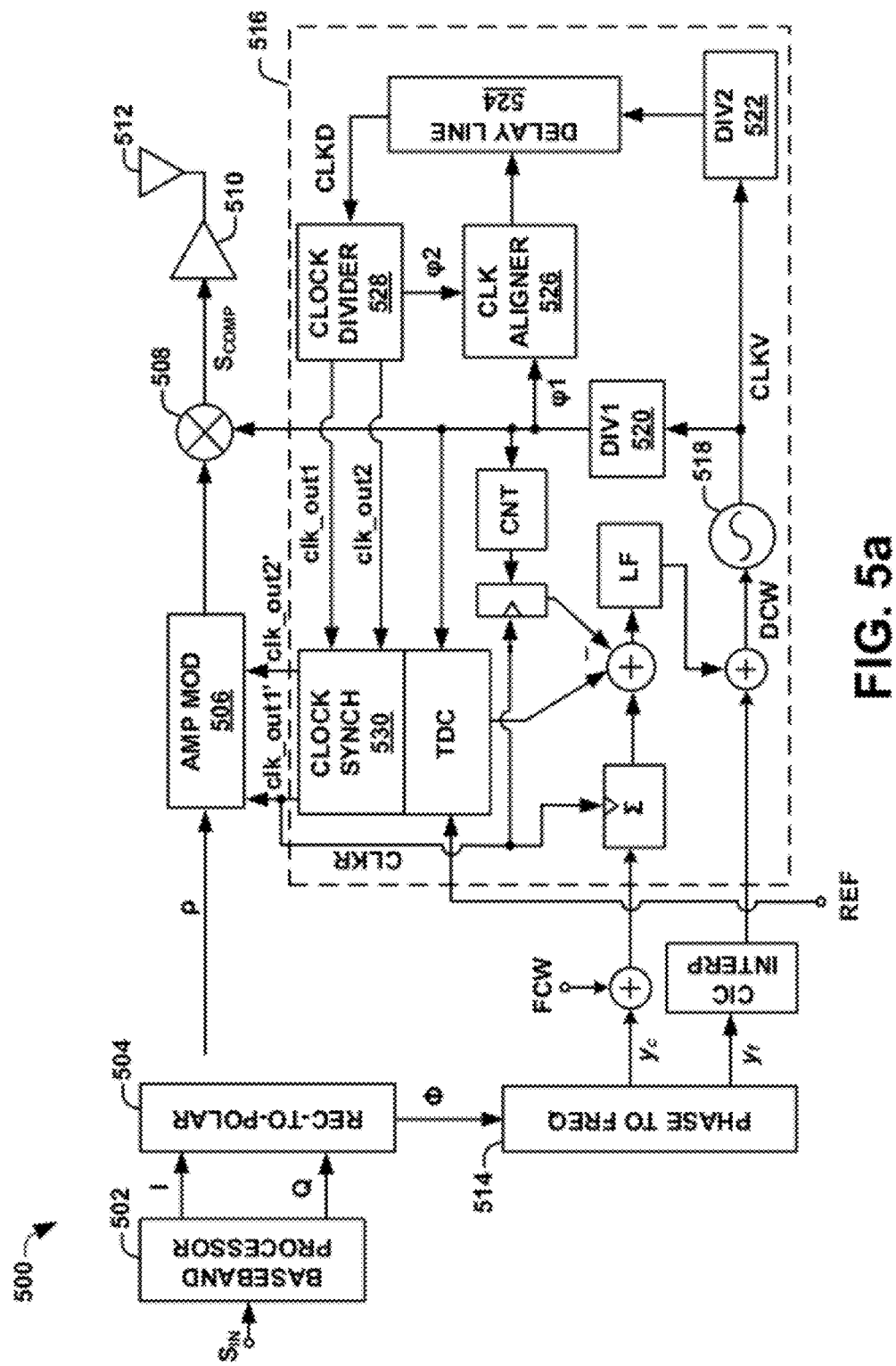
FIG. 5a illustrates a block diagram of a first embodiment of a polar transmission circuit comprising a digital phase locked loop configured to generate synchronous clock signals within different clock domains.

FIG. 5a illustrates a block diagram of a first embodiment of a polar transmission circuit 500 comprising a digital phase locked loop (ADPLL) 516 configured to generate time-aligned synchronous output clock signals within different clock domains. Although the polar transmission circuit 500 is illustrated as a polar transmitter, it will be appreciated that the ADPLL may be comprised within other transmission circuits such as a polar transceiver, for example.

As shown in FIG. 5a, the polar transmission circuit 500 comprises a baseband processor 502 configured to generate orthogonal in-phase (I) and quadrature-phase (Q) symbols from a digital input signal $S_{IN}$ to be transmitted. A rectangular-to-polar converter 504 is configured to receive the I/Q symbols and generate therefrom a digital amplitude modulation (AM) signal p and a phase/frequency modulation (PM/FM) signal φ. In one embodiment, the rectangular-to-polar converter 504 may comprise a CORDIC (Coordinate Rotation Digital Computer) configured to convert amplitudes of I/Q baseband signals into equivalent polar signals. The digital AM signal ρ is transmitted along a first signal path comprising a plurality of amplitude modulation components 506 (e.g., interpolators, digital to analog converters, etc.). The PM/FM signal φ is transmitted along a second signal path comprising a phase-to-frequency converter 514. The phase-to-frequency converter 514 generates a feedforward (or direct frequency modulation signal) $y_f$ that directly drives operation of DCO 518. The phase-to-frequency converter 514 also generates a compensating frequency $y_c$ signal, which in one embodiment may be added to a frequency command word (FCW). The FCW is provided to the digital PLL 516. The signals carried by the first and second signal paths are combined by a mixing circuit 508 (e.g., a power amplifier) to form an output signal $S_{COMP}$ that is provided to one or more amplification stages 510 before being received by an antenna 512 for wireless transmission.

In one embodiment, the DCO 518 may be configured to generate a variable clock signal operating at a higher frequency than the RF output frequency (e.g., 4800 MHz). Such operation may be beneficial for preventing interference (e.g., cross talk) between a transmission signal and other communication signals bands, for example. In such an embodiment, the DCO 518 may be coupled to one or more dividers 520, 522 configured to divide the variable clock signal to generate signals having different clock domains as described above. In particular, the DCO 518 is coupled to a first divider 520, configured to divide the variable clock signal to generate an RF output signal that is a carrier signal provided to the mixer 508, and a second divider 522 configured to divide the variable clock signal to generate a signal that is provided to programmable delay line 524 before being provided to a clock divider circuit 528 configured to generate a plurality of output clock signals clk_out1 and clk_out2.

A clock aligner 526 is to receive the signal output from the first divider 520 and signals output from a clock divider circuit 528, and to generate a control signal CTRL based upon a phase difference between the RF output signal and one or more output clock signals. The control signal CTRL operates the programmable delay line 524 to selectively introduce a time delay into the variable clock signal output from the second divider 522.

The clock divider circuit 528 may be further configured to generate one or more additional lower frequency signals (e.g., clk_out3, etc.) comprising a wide range of different reduced frequency signals that may be used throughout the polar transmission circuit 500 (e.g., in the digital part of the polar transmission circuit). In various embodiments, the one or more additional lower frequency signals that may be used by different components in the polar transmission circuit 500.

For example, in one embodiment the DCO 518 may be configured to generate a variable clock signal operating at 4804-4960 MHz. The first divider 520 may be configured to divide the variable clock signal by 2 to generate a RF output signal (carrier signal) operating at 2402-2480 MHz. The second divider 522 may be configured to divide the 4802-4960 MHz variable clock signal by 7 to generate a divided variable clock signal having a frequency of approximately 686-709 MHz. The clock divider circuit 528 may be configured to further divide the output of the second divider 522 (having a frequency of approximately 686-709), for example by 2 and 4, to generate a output clock signals that are provided to the phase and/or amplitude paths of the polar transmission circuit (FIG. 5a illustrates output signals provided to the amplitude path, not the phase path).

FIG. 5b illustrates a signal diagram corresponding to exemplary clock signals of the polar transmission circuit 500. As illustrated in FIG. 5b, a time delay Δt is introduced into the divided variable clock signal before the clock divider generates output clock signals clk_out1 and clk_out2. The time delay Δt brings the rising edges of the divided variable clock signal in line with the variable clock signal. The output clock signals are then generated by synchronous division of the delayed variable clock signal to have time-aligned clock edges (e.g., at time $T_2$) which are aligned with the variable clock signal (e.g., the reference signal). It will be appreciated that although the time delay Δt is illustrated in FIG. 5b as a single time delay, that the time delay may be introduced into the divided variable clock signal in an iterative manner over a plurality of clock cycles.

Figure 6:
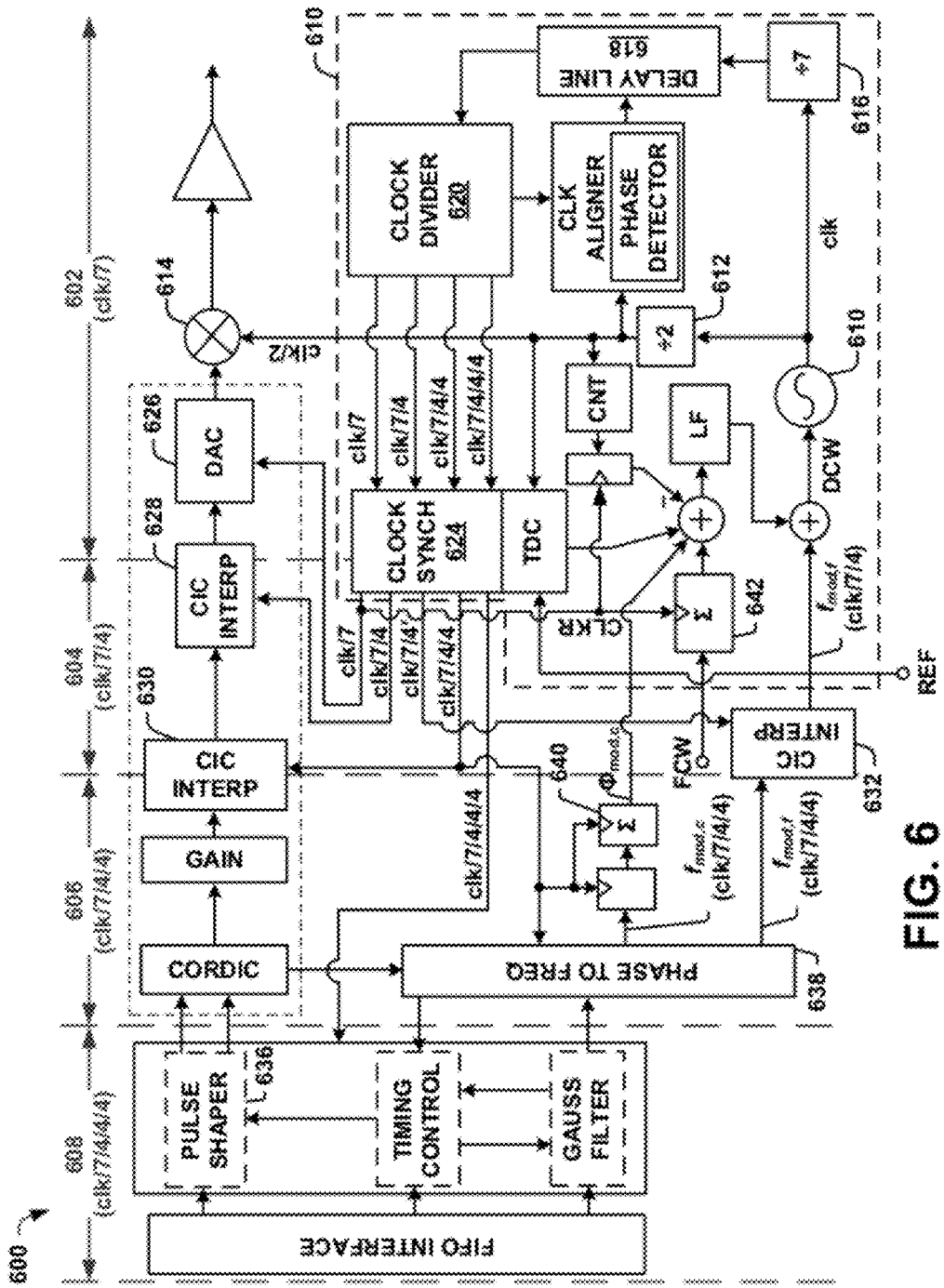
FIG. 6 illustrates a more detailed block diagram of a polar transmission circuit comprising a digital phase locked loop configured to generate time-aligned clock signals in a plurality of different clock domains.

FIG. 6 illustrates a more detailed block diagram of a polar transmission circuit 600 comprising a digital phase locked loop configured to generate time-aligned clock signals in a plurality of different clock domains. FIG. 6 particularly illustrates output clock signals from a clock synchronization unit being provided to different "clock/frequency domains" in the amplitude modulation path and phase/frequency modulation (PM/FM) path of polar transmission circuit 600. It will be appreciated that the frequency values and divider values illustrated in FIG. 6 are intended as a non-limiting example of the invention. For example, although the variable clock frequency in the example of FIG. 6 is described as operating at a frequency of 4804 to 4960 MHz, this is one non-limiting embodiment of the invention.

Referring to FIG. 6, in a first clock domain 602, the frequency of the variable clock signal output from DCO 610 is provided to a first frequency divider 612 configured to divide the frequency of the variable clock frequency (clk) by 2 to generate a first clock signal operating at a sampling frequency of 2402-2480 MHz (clk/2). The first clock signal is provided as a high frequency phase modulated carrier signal to a mixer 614, which introduces amplitude modulation to the PM carrier signal, to generate an output signal.

The variable clock signal is also provided to a second frequency divider 616 configured to divide the frequency of the variable clock frequency by 7 to obtain a divided variable clock signal having a signal having a frequency of 686 MHz-708 MHz (clk/7). The divided variable clock signal is provided to a delay element 618 that generates a delayed clock signal that is further provided to a clock divider circuit 620. The clock divider circuit 620 is configured to operate (e.g., further divide) upon the delayed clock signal (having a frequency of 686-708 MHz) to generate a plurality of time-aligned output clock signals having various frequencies.

For example, the clock divider circuit 620 may generate output clock signal clk/7 that remains at a frequency of 686 MHz-708 MHz. The output clock signal clk/7 may be used by clock synchronization unit 624 for retiming purposes and is then provided to an RF digital-to-analog converter (RF-DAC) 626 configured to convert the digital AM signal ρ to an analog current. RF-DAC 626 is comprised within the first clock domain 602, which operates at a sampling frequency of 686 MHz-708 MHz.

The clock divider circuit 620 may also generate an output clock signal clk/7/4 having an operating frequency of approximately 171 MHz to 177 MHz (i.e., that is equal to the divided variable clock signal frequency divided by 4). The output signal clk/7/4 may also be used by clock synchronization unit 624 for retiming purposes and to generate a clock signal clk/7/4 that is provided to a first CIC interpolator 628 in the amplitude modulation (AM) path and a clock signal clk/7/4' that is provided to a third CIC interpolator 632 in the phase/frequency modulation (PM/FM) path. CIC interpolators 628 and 632 are located within the second clock domain 604 and operate at a sampling frequency of approximately 171 MHz to 177 MHz. The first CIC interpolator 628 may be configured to shift the digital AM signal ρ to a proper sampling rate before it is provided to an RF digital to analog converter (RF-DAC) 626.

The clock divider circuit 620 may also generate a clock signal clk/7/4/4 having an operating frequency of approximately 42 MHz-44 MHz (i.e., that is equal to the divided variable clock signal frequency divided by 16). The clock signal clk/7/4/4 may be synchronized by the clock divider circuit 620 and then provided for digital operations in both the amplitude and the phase/frequency modulation paths within the, which operates at a sampling frequency of approximately 42 MHz-44 MHz. In one embodiment, the clock signal clk/7/4/4 may be used to clock digital operations performed by a second CIC interpolator 630 in the amplitude modulation (AM) path, a phase-to-frequency converter 638, and a CORDIC. In one embodiment, the clock signal clk/7/4/4 may alternatively comprise two or more separate clock signals that are output from the clock synchronization unit 624 (e.g., a clock signal clk/7/4/4 and a clock signal clk/7/4/4') and that are respectively provided to different components within the third clock domain 606.

Clocked by the clock signal clk/7/4/4, the phase-to-frequency converter 638 is configured to generate a feedforward (direct frequency modulation) signal $f_{mod,f}$ having a frequency of approximately 42 MHz-44 MHz and a compensating frequency modulation signal $f_{mod,c}$ also having a frequency of approximately 42 MHz-44 MHz. CIC interpolator 632 is configured to upconvert the feedforward signal $f_{mod,f}$ to approximately 171 MHz to 177 MHz (clk/7/4/) before it is provided to DCO 610. The compensating frequency modulation signal $f_{mod,c}$ is converted to a phase signal $\phi_{mod,c}$ by an integrator 640 and injected at the output of a reference phase accumulator 642, located upstream of the digitally controlled oscillator.

The clock divider circuit 620 may also generate a clock signal clk/7/4/4/4 having an operating frequency of approximately 10 MHz-11 MHz (i.e., that is equal to the divided variable clock signal frequency divided by 64). The clock signal clk/7/4/4/4 may be synchronized by the clock divider circuit 620 and then provided for digital operations (e.g., such as operations performed by the and pulse shaping filters 636) occurring in the fourth clock domain 608, which operates at a sampling frequency of approximately 10 MHz-11 MHz.

In alternative embodiments, the clock divider circuit 620 may generate additional output clock signals (not shown) that may be used in other analog or digital operations of the polar transmission circuit 600. Accordingly, as illustrated in FIG. 6, the clock divider circuit 620 is configured to generate time-aligned clock signals spanning multiple clock domains (e.g., frequency regions) wherein the polar transmission circuit operations performed in each of the frequency regions are dependent upon a reduction of a DCO variable clock signal frequency.

Figure 7:
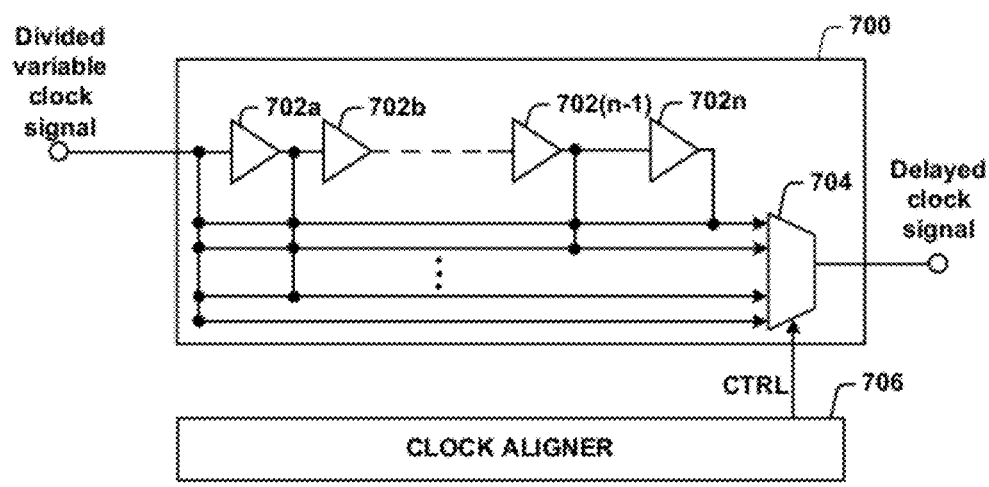
FIG. 7 is a more detailed block diagram of an exemplary programmable delay line configured to introduce a time delay into a variable clock signal.

FIG. 7 is a more detailed block diagram of an exemplary programmable delay line 700 configured to introduce a time delay into a variable clock signal. As illustrated in FIG. 7, the programmable delay line 700 comprises a plurality of buffers 702a through 702n configured to receive a divided variable clock signal (e.g., from a divider coupled to a DCO). Each buffer 702 is configured to introduce a small delay (e.g., a pico-second delay) into the divided variable clock signal. A plurality of delayed clock signals, generated by the plurality of buffers, may be provided to a multiplexor 704 configured to selectively set the delay of the programmable delay line 700 based upon a control signal CTRL provided by the clock aligner 706.

Therefore, in exemplary programmable delay line 700 the size of the delay introduced by the programmable delay line is directly proportional to the number of delay elements in the signal path chosen by the multiplexor 704. For example, the control signal CTRL may cause the multiplexor 704 to output a delayed variable clock signal having a small delay, caused by buffers 702a and 702b or the control signal CTRL may cause the multiplexor 704 to output a delayed variable clock signal having a larger delay, caused by buffers 702a-702(n−1).

Figure 8A:
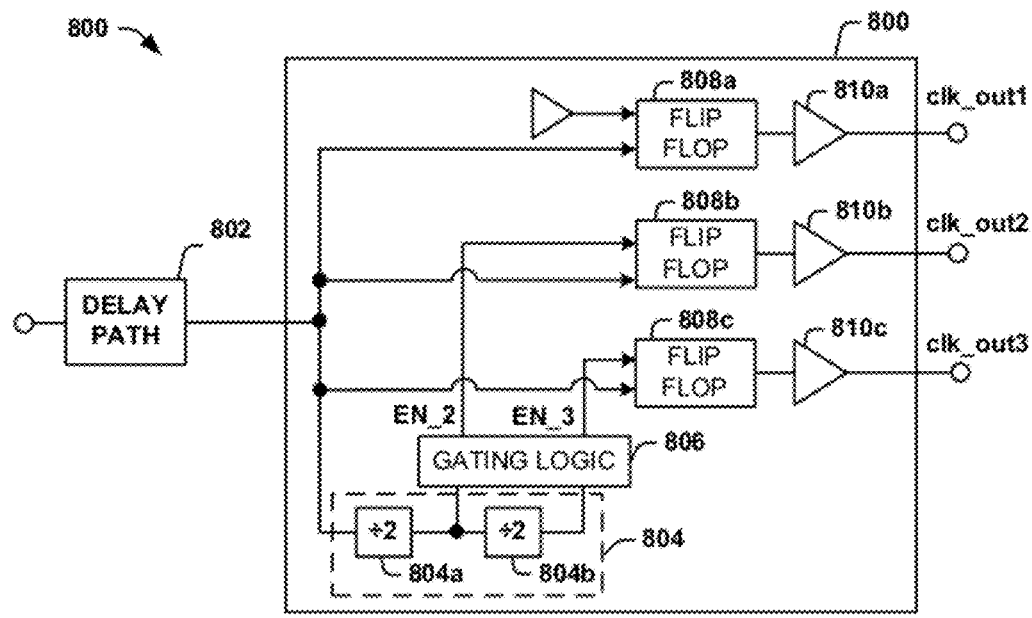
FIG. 8a illustrates an exemplary block diagram of a clock divider circuit, as provided herein

FIG. 8a illustrates an exemplary block diagram of a clock divider circuit 800, as provided herein (e.g., corresponding to clock divider circuit 214). As illustrated in FIG. 8a, the clock divider circuit 800 comprises a plurality of flip-flops 808 (e.g., edge triggered flip flops). Respective flips-flops 808a, 808b, 808c have a first input node coupled to the programmable delay line 802 and configured to receive the delayed clock signal, and a second input node coupled to gating logic element 806 and configured to receive an enable control signal EN_n. The delayed clock signal is also provided from the programmable delay line 804 to a one or more serially connected dividers 804 before being received by the gating logic element 806. As shown in FIG. 8a, a first divider 804a divides the frequency of the delayed clock signal by 2 before it is provided to the gating logic element 806, while a second divider 804b further divides the frequency of the delayed clock signal by 2 (i.e., cumulatively dividing the delayed clock signal by 4) before it is received by the gating logic element 806. The gating logic element 806 is configured to generate enable control signals EN_n that are provided to the flips-flops 808 and that that allows the clock divider circuit 800 to use clock gating to generate a plurality of synchronous clock signals. In one embodiment, wherein the flip-flops 808 comprise edge triggered flips-flops, when the enable signal goes high, the data state of the delayed clock signal provided at the first input node (e.g., from the delay line) is provided to a buffer 812 before being output as a output clock signal.

In one embodiment, a constant high signal may be provided to one of the flip flops 808a, therefore enabling the flip-flop to output a first divided clock signal that has a frequency that is equal to the delayed clock signal provided by the programmable delay line 802.

Figure 8B:
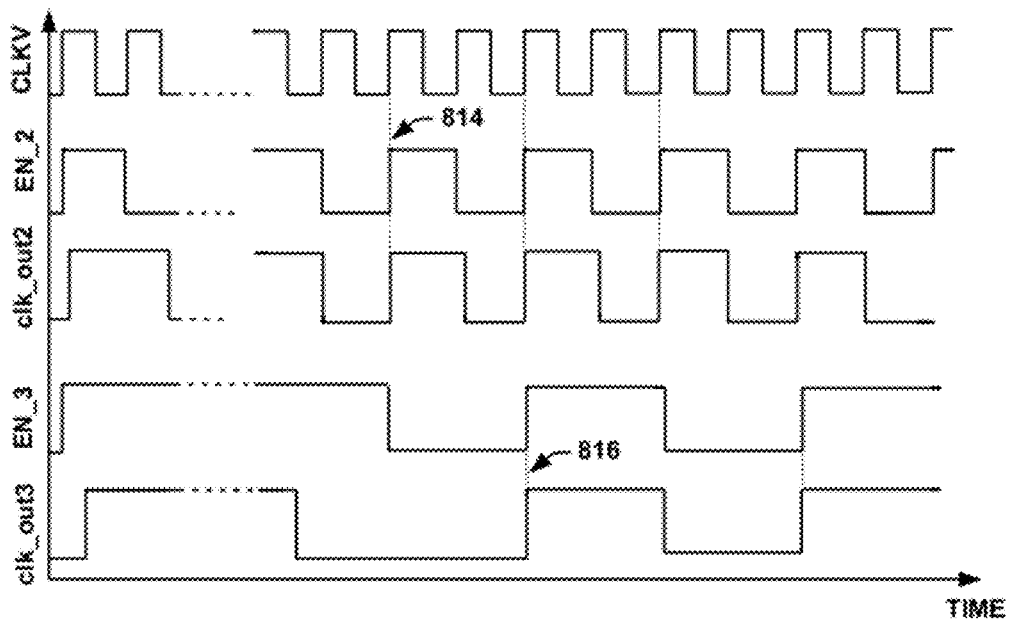

FIG. 8b illustrates an exemplary clock timing diagram associated with the clock divider circuit of FIG. 8a. As shown in FIG. 8b, the second control signal EN_2, provided by gating logic element 806, will go from a low data state to a high data state at a frequency that is ½ the frequency of the delayed clock signal. This results in second divided clock signal that has a frequency that is one half the frequency of the delayed variable clock signal. Furthermore, since the second divided clock signal is generated at the rising edge of the delayed clock signal the second divided clock signal is synchronous with the first divided clock signal (which is synchronous with the retimed clock signal).

Similarly, the third control signal EN_3, provided by gating logic element 806, will go from a low data state to a high data state at a frequency that is ¼ the frequency of the delayed variable clock signal. This results in third divided clock signal that has a frequency that is one fourth the frequency of the delayed clock signal and which is synchronous with the delayed clock signal. Furthermore, since the third divided clock signal is generated at the rising edge of the delayed variable clock signal the third divided clock signal is synchronous with the first and second divided clock signals (which is synchronous with the retimed clock signal).

Accordingly, as illustrated in FIGS. 8a-8b, the clock divider circuit is configured to utilize a clock gating methodology to selectively generate a plurality of clock divided signals having different frequencies and which are synchronous along their clock edges.

In one embodiment, the automatic clock alignment performed by a clock divider circuit (e.g., corresponding to clock divider circuit 214, 318, etc.) may be activated constantly. In alternative embodiments, the automatic clock alignment performed by a clock divider circuit may be selectively activated and deactivated (e.g., the gating logic 806 of the clock divider circuit 800 may be activated and deactivated). For example, during a TDMA transmission the alignment may be activated at the start of a burst and may be deactivated during an active transmission so as to prevent phase switching during the burst.

Figure 9A:
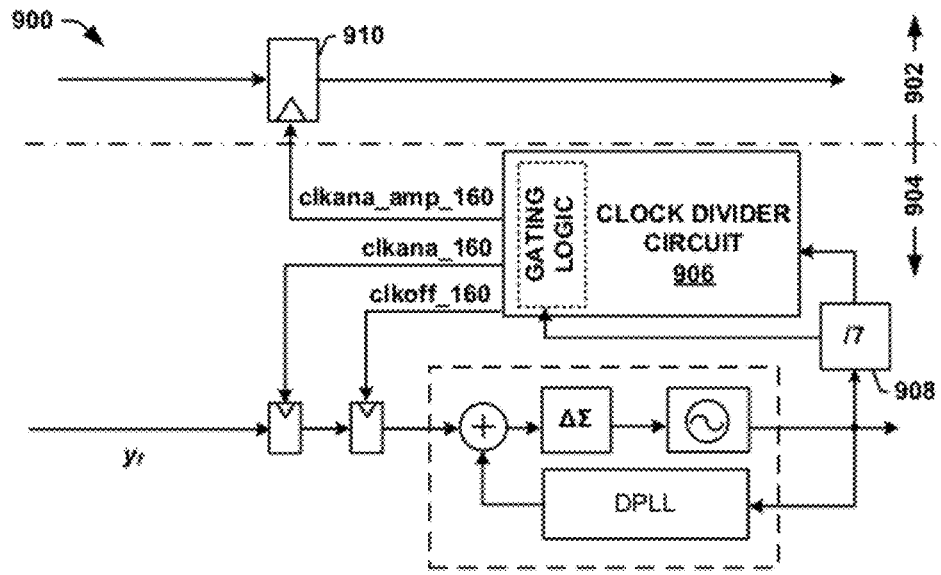
FIG. 9a illustrates an embodiment of a polar transmitter, illustrating outputs of the clock divider circuit that are provided to an amplitude modulation path and a phase modulation path

FIG. 9a illustrates an embodiment of a polar transmitter, illustrating aligned outputs clock signals from a clock divider circuit that are provided to an amplitude modulation path 902 and a phase modulation path 904. As illustrated in FIG. 9a, the clock divider circuit 906 is configured to receive a signal, having a frequency of approximately 700 MHz, from divider 908. The signal is divided to generate time aligned output clock signals that may be provided to both the amplitude modulation path 902 (clkana_amp_160) and to the phase modulation path 904 (clkana_160, clkoff_160) (i.e., the clock divider 906 is configured to provide phase adjustments to both clock provided to both the amplitude modulation path 902 and the phase modulation path).

Furthermore, because the clock divider 906 utilizes a gating technique that relies upon the 700 MHz clock to generate time aligned output clock signals (clkana_amp_160, clkana_160, clkoff_160), the edges clock output signals may be adjusted relative to one another with a granularity of the 700 MHz clock. This allows for alignment in the amplitude path (e.g., via clkana_160) to be performed separate from alignment in the phase path (e.g., via clkoff_160).

For example, as shown in FIG. 9a, the amplitude path 902 may comprise a flip-flop 910 configured to receive a 160 MHz output clock signal (clkana_amp_160) that has been phase shifted (e.g., advanced and/or retarded in a positive and negative direction) independent of the output clock signals used in the phase path 904 (clk_ana_160, clkoff_160).

Figure 9B:
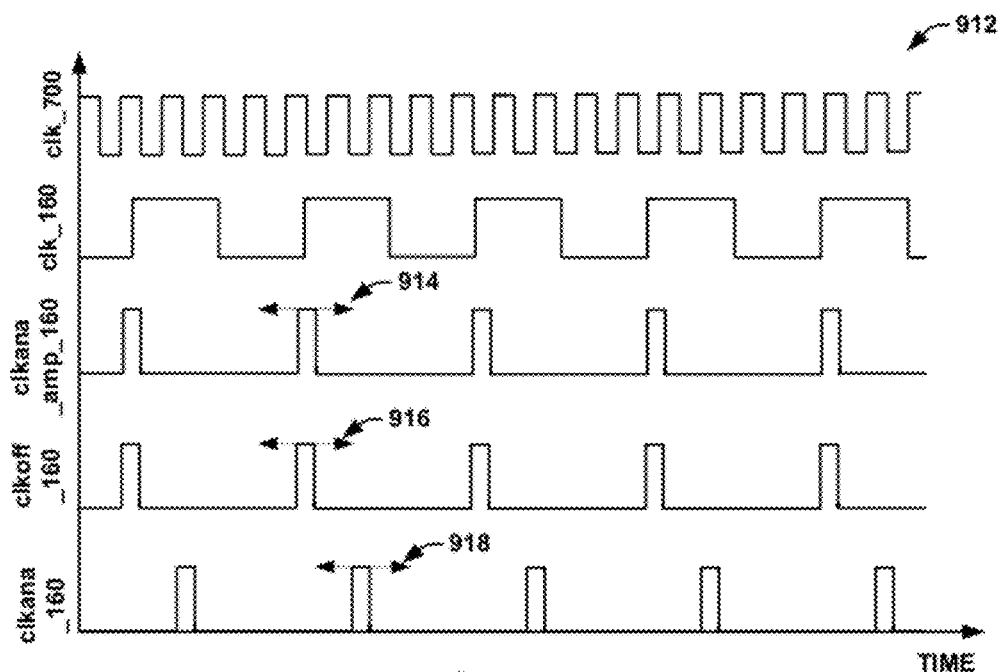
FIG. 9b illustrates timing diagrams of the clock signals input to and output from clock divider.

FIG. 9b illustrates timing diagrams 912 of the clock signals input to and output from clock divider 906. In particular, the 160 MHz clock output signals (clkana_amp_160, clkana_160, clkoff_160) provided to the phase path 904 and the amplitude path 902 are adjusted according to clk_700 (the 700 MHz clock signal output from divider 908), making a fine adjustments 914-918 to the phase of the signals. For example, a first time adjustment 914 (e.g., delay, advance) is made to clock clkana_amp_160 based upon the clk_700 signal, while second and third time adjustments, 916 and 918 (e.g., equal to or different than time adjustment 914) are made to clkana_160 and clockoff_160, respectively, based upon the clk_700 signal.

Figure 10:
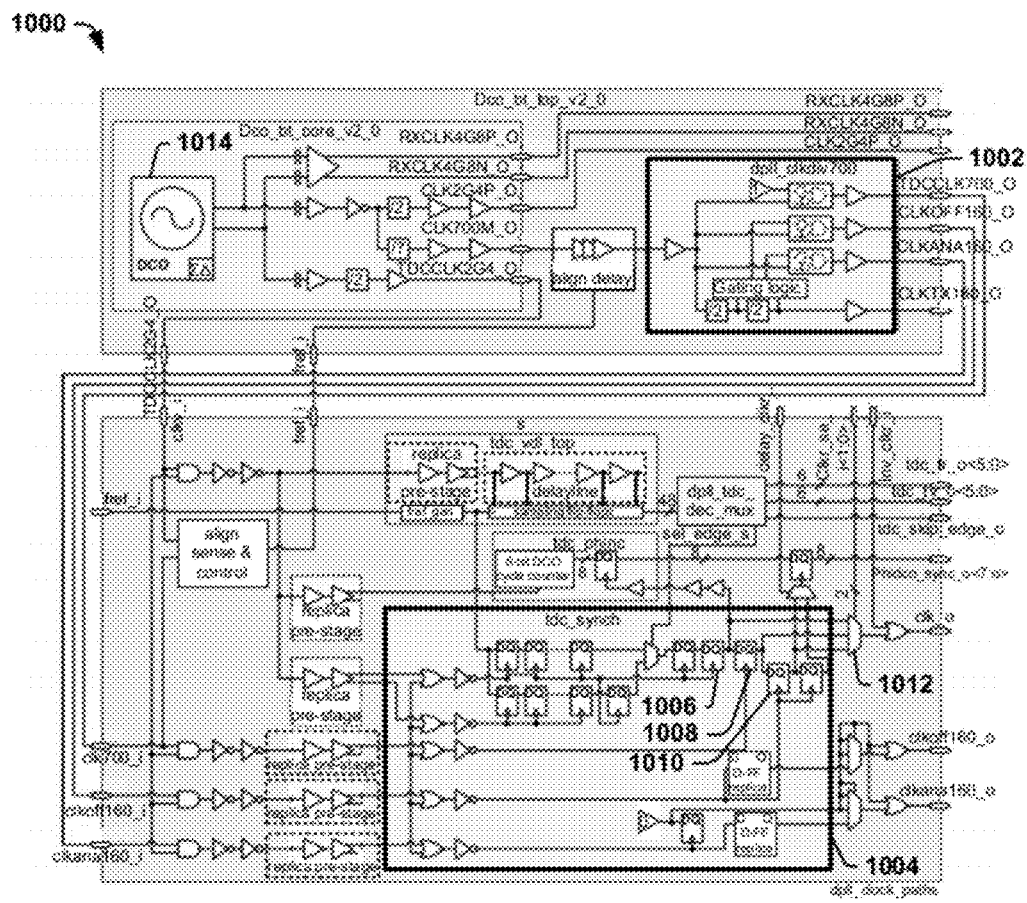
FIG. 10 illustrates a more detailed embodiment of a clock synchronization unit comprised within a digital phase locked loop.

In an alternative embodiment, a more course adjustment to the time alignment of the clock output signals provided to the phase and amplitude paths can be realized by delaying the amplitude signal through a multiplexor operated using the 160 MHz clock FIG. 10 illustrates a more detailed embodiment of a clock synchronization unit comprised within a digital phase locked loop (ADPLL) 1000. It will be appreciated that FIG. 10 illustrates a non-limiting embodiment of a clock synchronization unit.

The ADPLL 1000 comprises a clock divider circuit 1002 configured to generate a plurality of output clock signals (TDCCLK700_O, CLKOFF160_O, CLKANA160_O) that are provided to a clock synchronization unit 1004 where they are used for re-sampling of the reference clock fref_i in order to generate retimed clock clkr_o, which serves as the master clock for the ADPLL 1000.

The clock synchronization unit 1004 comprises a plurality of flip-flops that are clocked using different frequency clock signals. The flip-flops are configured to perform re-sampling of the reference clock signal fref_i to generate a retimed clock signal clkcr_o.

More particularly, flip-flop 1006 is configured to receive the reference clock signal fref_i. Flip-flop 1006 is clocked at a frequency equal to the frequency of the variable clock signal (TDCCLK2G4_O) provided by the DCO 1014 divided by two (clk/2), therefore re-sampling the reference clock signal fref_i at a frequency of clk/2. Flip-flop 1008 is configured to receive the re-sampled reference clock signal output from flip-flop 1006. Flip-flop 1008 is clocked according to clk700_i (output from the clock divider circuit 1002), therefore further re-sampling the re-sampled reference clock output from flip-flop 1006 using a 700 MHz signal. Flip-flop 1010 is configured to receive the re-sampled reference clock signal output from flip-flop 1008. Flip-flop 1010 is clocked according to clkoff160_i (output from the clock divider circuit 1002), therefore further re-sampling the re-sampled reference clock output from flip-flop 1008 using a 160 MHz signal.

A multiplexor 1012 is configured to receive the re-sampled reference clock signals output from each of flip-flops 1006, 1008, and 1010 and to selectively determine the retimed clock signal clkcr_o therefrom. Therefore, the clock synchronization unit 1004 is configured to generate a retimed clock signal using one or more of the plurality of time-aligned output clocks (generated by clock divider circuit 1002) for re-sampling of a reference clock signal fref_i, in order to generate a retimed clock signal clkcr_o that is used as a master clock for the ADPLL 1000.

Figure 11:
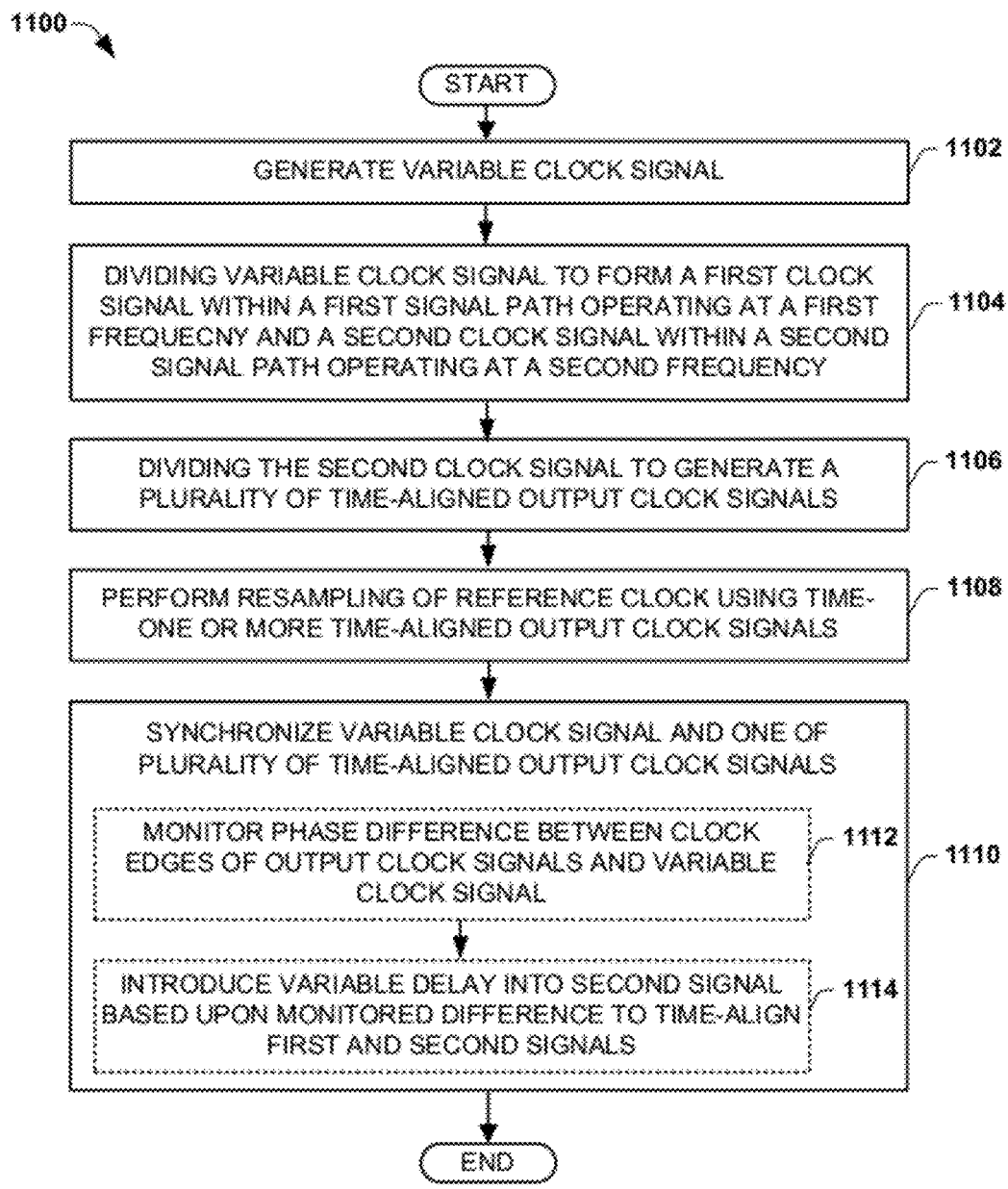
FIG. 11 is a flow diagram showing an additional embodiment of a method for preventing remodulation in a transmission chain.

FIG. 11 is a flow diagram of a method for generating a plurality of time-aligned clock signals spanning a plurality of different frequency domains with a digital phase locked loop. While the methods provided herein are illustrated and described below as a series of acts or events, the present disclosure is not limited by the illustrated ordering of such acts or events. For example, some acts may occur in different orders and/or concurrently with other acts or events apart from those illustrated and/or described herein. In addition, not all illustrated acts are required and the waveform shapes are merely illustrative and other waveforms may vary significantly from those illustrated. Further, one or more of the acts depicted herein may be carried out in one or more separate acts or phases.

Furthermore, the claimed subject matter may be implemented as a method, apparatus, or article of manufacture using standard programming and/or engineering techniques to produce software, firmware, hardware, or any combination thereof to control a computer to implement the disclosed subject matter (e.g., the circuits shown in FIG. 2, etc., are non-limiting examples of circuits that may be used to implement method 1100). The term "article of manufacture" as used herein is intended to encompass a computer program accessible from any computer-readable device, carrier, or media. Of course, those skilled in the art will recognize many modifications may be made to this configuration without departing from the scope or spirit of the claimed subject matter.

At 1102 a variable clock signal is generated. In one embodiment, the variable clock signal may be generated by a digital controlled oscillator to have a frequency that is equal to an RF frequency. In an alternative embodiment, the variable clock signal may be generated by a digital controlled oscillator to have a frequency that is greater than (e.g., twice) an RF frequency.

At 1104 the variable the variable clock signal is divided to form a first clock signal within a first signal path operating at a first frequency and a second clock signal within a second signal path operating at a second frequency different than the first frequency. For example, the variable clock signal may be divided by two to generate the first clock signal and by seven to generate the second clock signal. Accordingly, the first and second clock signals having different operating frequencies.

At 1106 the second clock signal is divided to generate a plurality of time-aligned output clock signals. In one embodiment (step 908), the plurality of time-aligned clock signals may be generated using a clock gating methodology, wherein a clock transition (e.g., a rising edge, falling edge) of the plurality of output clock signals is generated based upon an enable control signal. The clock gating methodology is described in more detail above in regards to FIG. 8a-8b.

At 1108 a reference clock is re-sampled using one or more of the plurality of time-aligned output clock signals to generate a retimed clock signal. The retimed clock signal may be used as a master clock for the digital phase locked loop.

At 1110 the variable clock signal is automatically synchronized with the plurality of time-aligned output clock signals. Synchronization may comprise time aligning the rising or falling edges of the variable clock signal and the one of the plurality of output clock signals. It will be appreciated that method 1100 may be iteratively performed. For example, synchronization of the variable clock signals may be achieved over a plurality of iterations of the method 1100.

In one embodiment, synchronization may be performed by monitoring a phase difference between clock edges of the output clock signals and the variable clock signal (step 1112). In one embodiment, a phase detector may monitor a phase difference between clock edges (e.g., rising clock edges, falling clock edges) of the variable clock signal and one of the plurality of time-aligned output clock signals. A time delay may then be introduced into the second clock signal, based upon the monitored difference between clock edges of the output clock signals and the variable clock signal (step 1114).

In one embodiment, a control signal may be generated based upon the detected phase difference, which causes a programmable delay element to selectively introduce a time delay into the second clock signal, which shifts clock edges of the second clock signal in a manner that time aligns the output clock signals with the variable clock signal.

Although the invention has been illustrated and described with respect to one or more implementations, alterations and/or modifications may be made to the illustrated examples without departing from the spirit and scope of the appended claims. In particular regard to the various functions performed by the above described components or structures (assemblies, devices, circuits, systems, etc.), the terms (including a reference to a "means") used to describe such components are intended to correspond, unless otherwise indicated, to any component or structure which performs the specified function of the described component (e.g., that is functionally equivalent), even though not structurally equivalent to the disclosed structure which performs the function in the herein illustrated exemplary implementations of the invention. In addition, while a particular feature of the invention may have been disclosed with respect to only one of several implementations, such feature may be combined with one or more other features of the other implementations as may be desired and advantageous for any given or particular application. Furthermore, to the extent that the terms "including", "includes", "having", "has", "with", or variants thereof are used in either the detailed description and the claims, such terms are intended to be inclusive in a manner similar to the term "comprising".

What is claimed is:

1. A phase locked loop, comprising:
   a digitally controlled oscillator configured to generate a variable clock signal;
   a first signal path comprising a first clock signal operating within a first clock domain having a first frequency range, the first signal path comprising a time-to-digital converter configured to generate a PLL feedback signal that drives the variable clock signal to follow a reference signal;
   a second signal path having a second clock signal operating within a second clock domain having a second frequency range, the second signal path comprising a clock divider circuit configured to generate a plurality of automatically time-aligned output clock signals from the second clock signal, respectively having different frequencies; and
   a clock aligner configured to generate a control signal based upon a detected phase difference between the variable clock signal and one of the plurality of time-aligned output clock signals, and used to automatically synchronize rising or falling edges of the variable clock signal and the plurality of output clock signals.

2. The phase locked loop of claim 1, wherein the second signal path, comprises:
   a programmable delay line located upstream of the clock divider circuit and configured to selectively introduce a time delay into the second clock signal, based upon the detected phase difference, that shifts clock edges of the second clock signal in a manner that time aligns the output clock signals with the variable clock signal,
   wherein the clock divider circuit is configured to receive and divide the second clock signal to generate the plurality of time-aligned output clock signals.

3. The phase locked loop of claim 2, wherein the clock divider circuit is configured to perform clock gating of the delayed clock signal to generate the plurality of time-aligned output clock signals.

4. The phase locked loop of claim 3, wherein the clock divider circuit comprises:
   a plurality of dividers connected serially to the programmable delay line and configured to generate a plurality of divided clock signals having a plurality of different frequencies;
   a gating logic element configured to receive the plurality of divided clock signals and to generate a plurality of enable control signals operating at a plurality of different frequencies therefrom; and
   a plurality of flip-flops respectively having a first input node coupled to the programmable delay line and configured to receive the delayed clock signal, and a second input node coupled to the gating logic element and configured to receive one of the plurality of enable control signals;

wherein the flip-flops output the plurality of time-aligned output clock signals having rising edges are formed at rising edges of the enable control signals.

5. The phase locked loop of claim 2, wherein the clock aligner comprises a phase detector configured to monitor the rising or falling edges of the variable clock signal and one of the plurality of output clock signals and to generate the control signal that iterative adjusts the time delay introduced by the programmable delay line until the rising or falling edges of the variable clock signal and the one of the plurality of output clock signals are aligned in time.

6. The phase locked loop of claim 2, further comprising a clock synchronization unit coupled to outputs of the clock divider and configured to generate a retimed clock signal using one or more of the plurality of time-aligned output clocks for re-sampling of a reference clock.

7. The phase locked loop of claim 2, further comprising:
a first divider coupled between the output of the digitally controlled oscillator and the clock aligner; and
a second divider coupled between the output of the digitally controlled oscillator and the programmable delay line.

8. The phase locked loop of claim 7, wherein the first divider comprises a divide-by-2 divider and the second divider comprises a divide-by-7 divider.

9. A polar transmission circuit, comprising a digital phase locked loop configured to generate a plurality of output clock signals spanning a plurality of frequency domains, comprising:
a digitally controlled oscillator configured to generate a variable clock signal having a first frequency;
a first divider configured to receive the variable clock signal and divide the frequency of the variable clock signal to generate a divided variable clock signal;
a clock divider circuit configured to receive the divided variable clock signal and to further divide the divided variable clock signal to generate a plurality of automatically time-aligned output clock signals;
a clock aligner configured to monitor a phase difference between the variable clock signal and one of the plurality of time-aligned output clock signals; and
a programmable delay line configured to selectively introduce a time delay into the divided variable clock signal, based upon the phase difference, that shifts clock edges of the divided variable clock signal in a manner that automatically time aligns clocked edges of the plurality of output clock signals with clock edges of the variable clock signal.

10. The circuit of claim 9,
wherein a phase modulated carrier signal is generated from the variable clock signal and is provided to a mixer in an amplitude modulation path configured to introduce amplitude modulation on the phase modulated carrier signal, and
wherein one or more of the plurality of time-aligned output clock signals are provided to the amplitude modulation path thereby providing phase adjustment of the time-aligned output clock signals provided to the amplitude modulation path and a phase/frequency modulation path.

11. The circuit of claim 10, further comprising:
a first divider coupled between the output of the digitally controlled oscillator and the clock aligner; and
a second divider coupled between the output of the digitally controlled oscillator and the programmable delay line and configured to generate a divided variable clock signal.

12. The circuit of claim 11, wherein the clock divider circuit is configured to provide the phase adjustment of the output clock signals that are provided to the amplitude modulation path and the phase/frequency modulation path on a grid of the divided variable clock signal output from the second divider.

13. The circuit of claim 10, wherein the phase/frequency modulation path comprises a phase-to-frequency converter configured to generate a feedforward modulation signal and a compensating frequency modulation signal,
wherein the feedforward modulation signal directly drives operation of the digitally controlled oscillator, and
wherein the compensating frequency modulation signal is converted to a phase signal by an integrator and injected at the output of a reference phase accumulator located upstream of the digitally controlled oscillator.

14. The circuit of claim 13, wherein the clock divider circuit comprises:
a plurality of dividers connected serially to the programmable delay line and configured to generate a plurality of divided clock signals having a plurality of different frequencies;
a gating logic element configured to receive the plurality of divided clock signals and to generate a plurality of enable control signals operating at a plurality of different frequencies therefrom; and
a plurality of flip-flops respectively having a first input node coupled to the programmable delay line and configured to receive the delayed clock signal, and a second input node coupled to the gating logic element and configured to receive one of the plurality of enable control signals;
wherein the flip-flops are configured to generate a plurality of time-aligned clock signals based upon the enable control signals.

15. The circuit of claim 13, wherein the clock divider circuit may be selectively activated to generate the time aligned output clock signals and selectively deactivated to not generate the time aligned output clock signals.

16. The circuit of claim 9, further comprising a clock synchronization unit coupled to outputs of the clock divider and configured to generate a retimed clock signal using one or more of the plurality of time-aligned output clocks for re-sampling of a reference clock.

17. A method for generating time-aligned clock signals with a digital phase locked loop, comprising:
generating a variable clock signal;
dividing the variable clock signal to form a first clock signal within a first signal path operating at a first frequency range and a second clock signal within a second signal path operating at a second frequency range different than the first frequency range;
dividing the second clock signal to generate a plurality of automatically time-aligned output clock signals; and
synchronizing the rising or falling edges of the variable clock signal and the one of the plurality of output clock signals.

18. The method of claim 17, wherein synchronizing the rising or falling edges of the variable clock signal and the one of the plurality of output clock signals, comprises:
monitoring a phase difference between the variable clock signal and the one of the plurality of time-aligned output clock signals; and
selectively introducing a delay into the second clock signal based upon the phase difference, to shift clock edges of the second clock signal in a manner that time aligns clock edges of the output clock signals with clock edges of the variable clock signal.

19. The method of claim 18, wherein generating a plurality of time-aligned synchronous output clock signals comprises clock gating the delayed second clock signal.

20. The method of claim 19, further comprising re-sampling a reference clock using one or more of the plurality of output clock signals to generate a retimed clock signal.

* * * * *